(12) United States Patent
Kwan

(10) Patent No.: US 6,937,177 B2
(45) Date of Patent: *Aug. 30, 2005

(54) SHUFFLER APPARATUS AND RELATED DYNAMIC ELEMENT MATCHING TECHNIQUE FOR LINEARIZATION OF UNIT-ELEMENT DIGITAL-TO-ANALOG CONVERTERS

(75) Inventor: Tom W. Kwan, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/847,459

(22) Filed: May 18, 2004

(65) Prior Publication Data

US 2004/0252041 A1 Dec. 16, 2004

Related U.S. Application Data

(63) Continuation of application No. 10/225,353, filed on Aug. 22, 2002, now Pat. No. 6,762,702.
(60) Provisional application No. 60/350,386, filed on Jan. 24, 2002.

(51) Int. Cl.[7] .............................................. H03M 1/66
(52) U.S. Cl. ..................... 341/144; 341/145; 341/118
(58) Field of Search ................................. 341/144, 145, 341/118, 120, 141, 143

(56) References Cited

U.S. PATENT DOCUMENTS

| | | | | |
|---|---|---|---|---|
| 5,056,087 A | * | 10/1991 | Ferguson | 370/540 |
| 5,404,142 A | * | 4/1995 | Adams et al. | 341/144 |
| 5,406,283 A | * | 4/1995 | Leung | 341/143 |
| 6,124,813 A | * | 9/2000 | Robertson et al. | 341/143 |
| 6,128,813 A | | 10/2000 | Rodriquez | |
| 6,266,002 B1 | | 7/2001 | Gong et al. | |
| 6,348,884 B1 | * | 2/2002 | Steensgaard-Madsen | 341/118 |
| 6,456,218 B1 | * | 9/2002 | Dedic et al. | 341/144 |
| 6,570,521 B1 | * | 5/2003 | Schofield | 341/144 |
| 6,720,897 B1 | | 4/2004 | Wang | |
| 2002/0063647 A1 | | 5/2002 | Brooks et al. | |
| 2002/0070887 A1 | | 6/2002 | Brooks et al. | |

OTHER PUBLICATIONS

Ian Galton, "Spectral Shaping of Circuit Errors in Digital-to-Analog Converters," IEEE Transactions on Circuits and Systems—II: Analog and Digital Signal Processing vol. 44, No. 10 pp. 808–817, IEEE (Oct. 1977).

Grillo et al., "A 12-mW ADC Delta-Sigma Modulator With 80 dB of Dynamic Range Integrated in a Single-Chip Bluetooth Transceiver," IEEE Journal of Solid –State Circuits, vol. 37, No. 3, pp. 271–278, IEEE (Mar. 2002).

Welz et al., "Simplified Logic for First-Order and Second-Order Mismatch-Shaping Digital-to-Analog Converters," IEEE Transactions on Circuits and Systems–II: Analog and Digital Signal Processing, vol. 48, No. 11, pp. 1014–1027, IEEE, (Nov. 2001).

(Continued)

*Primary Examiner*—John B Nguyen
(74) *Attorney, Agent, or Firm*—Sterne, Kessler, Goldstein & Fox P.L.L.C.

(57) ABSTRACT

A data shuffler apparatus shuffles input bits to perform dynamic element matching. The shuffler apparatus includes N input shufflers, each input shuffler having N input terminals and N output terminals, each input terminal of each input shuffler receiving a respective one of the input bits. The apparatus also includes N output shufflers, each output shuffler having N input terminals and N output terminals, the input and output shufflers being interconnected such that each of the N output terminals of each input shuffler is connected to a respective input terminal of a different one of the N output shufflers.

11 Claims, 9 Drawing Sheets

OTHER PUBLICATIONS

Adams et al., "A 113–dB SNR Oversampling DAC with Segmented Noise–Shaped Scrambling," IEEE Journal of Solid–State Circuits, vol. 33, No. 12, pp. 1871–1878, IEEE (Dec. 1998).

Kwan et al., "A Stereo Multibit ΣΔ DAC with Asynchronous Master–Clock Interface," IEEE Journal of Solid–State Circuits, vol. 31, No. 12, pp. 1881–1887, IEEE (Dec. 1996).

Yasuda et al., "A Third–Order Δ–Σ Modulator Using Second–Order Noise–Shaping Dynamic Element Matching," IEEE Journal of Solid–State Circuits, vol. 33, No. 12, pp. 1879–1886, IEEE (Dec. 1998).

Radke et al., "A Spurious–Free Delta–Sigma DAC Using Rotated Data Weighted Averaging," IEEE 1999 Custom Integrated Circuits Conference, pp. 125–128, IEEE (1999).

Baird et al., "Improved ΔΣ DAC Linearity Using Data Weighted Averaging", pp. 13–16, IEEE (1995).

Radke et al., "A 14–Bit Current–Mode ΣΔ DAC Based Upon Rotated Data Weighted Averaging," IEEE Journal of Solid-State Circuits, vol. 35, No. 8, pp. 1074–1084, IEEE (Aug. 2000).

Chen et al., "An Improved Technique for Reducing Baseband Tones in Sigma–Delta Modulators Employing Data Weighted Averaging Algorithm Without Adding Dither," IEEE Transactions on Circuits and Systems–II: Analog and Digital Signal Processing, vol. 46., No. 1, pp. 63–68, IEEE (Jan. 1999).

Chen et al., "Some Observations on Tone Behavior in Data Weighted Averaging," Proceedings of the 1998 International Symposium on Circuits and Systems, vol. 1, pp. 500–503, IEEE (1998).

Morteza Vadipour, "Techniques for Preventing Tonal Behavior of Data Weighted Averaging Algorithm in ΣΔ Modulators," IEEE Transactions on Circuits and Systems–II: Analog and Digital Signal Processing, vol. 47, No. 11, pp. 1137–1144, IEEE (Nov. 2000).

Zelniker et al., Advanced Digital Signal Processing Theory and Applications, pp. 357–364, Marcel Dekker, Inc. (1994).

Norsworthy et al., Delta–Sigma Data Converters Theories, Design and Simulation, pp. 185–186, IEEE Press, no date.

Jensen et al., "A Low–Complexity Dynamic Element Matching DAC for Direct Digital Synthesis," IEEE Transactions on Circuits and Systems–II: Analog and Digital Signal Processing, vol. 45, No. 1, pp. 13–27, IEEE (Jan. 1998).

Annovazzi et al., "A Low–Power 98–dB Multibit Audio DAC in a Standard 3.3–V 0.35–$\mu$m CMOS Technology," IEEE Journal of Solid–State Circuits, vol. 37, No. 7, pp. 825–834, IEEE (Jul. 2002).

Welz et al., "A Necessary and Sufficient Condition for Mismatch Shaping in Multi–Bit DACS," IEEE, pp. I–105 to I–108, IEEE (2002).

Fishov et al., "Segmented Mismatch–Shaping D/A Conversion," IEEE, pp. IV–679 to IV–682, IEEE (2002).

Fogleman et al., "A Digital Common–Mode Rejection Technique for Differential Analog–to–Digital Conversion," IEEE Transactions on Circuits and Systems–II: Analog and Digital Signal Processing, vol. 48, No. 3, pp. 255–271, IEEE (Mar. 2002).

Lin et al., "A Bandpass Mismatch–Shaped Multi–Bit ΣΔ Switched–Capacitor DAC using Butterfly Shuffler," 1999 IEEE International Solid–State Circuits Conference, 0–7803–5129–0/99, IEEE (1999).

* cited by examiner

C-model Simulation of Modulator/Shuffler

- bit accurate modeling of modulator and shuffler in C
- assumes capacitor mismatches of 1% (sigma)
- input frequency @ 25 kHz
- ENOB calculated using curve fit after brickwall filtering @ 150 kHz
- Sim results include a 2$^{nd}$ order truncation feedback type modulator

FIG. 5

SHUFFLER APPARATUS AND RELATED DYNAMIC ELEMENT MATCHING TECHNIQUE FOR LINEARIZATION OF UNIT-ELEMENT DIGITAL-TO-ANALOG CONVERTERS

CROSS-REFERENCE TO RELATED APPLICATIONS

This application claims the benefit of U.S. Provisional Application No. 60/350,386, filed Jan. 24, 2002, entitled "Dynamic Element Matching Technique for Linearization of Unit-Element Digital-To-Analog Converters," and is a continuation of U.S. application Ser. No. 10/225,353, filed Aug. 22, 2002 is now U.S. Pat. No. 6,762,702, entitled "Shuffler Apparatus and Related Dynamic Element Matching Technique for Linearization of Unit-Element Digital-To-Analog Converters," each of which is incorporated herein by reference in its entirety.

BACKGROUND OF THE INVENTION

In high resolution digital-to-analog converters (DACs), performance metrics such as linearity and noise are nominally determined by the matching of parameters derived from physical quantities in the construction of the DACs on an integrated circuit (IC), such as width, length, thickness, doping, etc. As a general rule, for each additional bit of performance in the DAC, parameter matching needs to be twice as tight. This translates to an increase by a factor of four in the IC area required by the DAC. When the DAC resolution is in the 16-bit range, it is no longer practical/economical to use size alone to achieve the required matching.

Over-sampled (sigma-delta) DACs (also referred to as "converters") alleviate the need for raw matching using single-bit conversion (so called 1-bit DACs in CD players). A single-bit DAC has only two points in a transfer function of the DAC, and thus is inherently linear. The function of a sigma-delta modulator with a one-bit quantizer is to approximate a high resolution low frequency signal with a high frequency two-level signal. The drawback here is this produces large amounts of out-of-band, for example, high frequency, noise.

One solution is to use more than two levels of quantization. For example, 17 levels may be used. However, now linearity requirements are to the full resolution of the DAC. That is, for a 16-bit DAC, the transfer function of the DAC with these quantization levels must be collinear to 1 part in $2^{16}$, which is 1 part in 65,536. Such linearity is difficult to achieve with raw parameter matching of the single-bit DACs. Thus, there is need to achieve such linearity in a multi-level DAC using an alternative to raw parameter matching.

SUMMARY OF THE INVENTION

For high resolution over-sampled DACs, where the signal frequency band is much smaller than the sample rate of the DAC, there exists an opportunity to apply what is referred to as dynamic element matching to lessen the requirement for raw device matching. This is an entirely digital technique that operates on logic signals. Nominally, without dynamic element matching, mismatched single-bit DAC devices generate errors across all frequency bands, including low frequencies where the signals of interest reside. With dynamic element matching, these errors at the low frequencies (that is, in low frequency bands) are modulated to higher frequencies, outside the signal band of interest, where they can be substantially eliminated with a lowpass filter.

The present invention uses dynamic element matching of the single-bit DACs in a multi-bit DAC, to get full multi-bit (for example, 16-bit) accuracy. The main idea of dynamic element matching is to make each equally weighted unit element (that is, each single-element DAC) in the DAC perform equal work. For direct-current (DC) signals (that is, signals at zero Hz), the cancellation is perfect or nearly perfect. For low frequency signals, the errors are filtered with a 1st order highpass transfer function equal to $(1-z^{-1})$ in the frequency domain. In particular, the transfer function approximates $\sin(\pi f_s/2)/(\pi f_s/2)$, where $f_s$ is the sample frequency.

The higher the over-sample ratio (where the over-sample ratio is defined as the sample frequency of the sigma-delta modulator over the signal frequency), the more effectively dynamic element matching can modulate the mismatch noise to out of band frequencies, that is, to frequencies away from the frequencies of interest.

According to an embodiment of the present invention, a data shuffler apparatus performs data shuffling of input bits to effect the dynamic element matching mentioned above. The data shuffler apparatus includes N input shufflers, each input shuffler having N input terminals and N output terminals, where N>2, each input terminal of each input shuffler receiving a respective one of the input bits. The shuffler apparatus also includes N output shufflers, each output shuffler having N input terminals and N output terminals, the input and output shufflers being interconnected such that each of the N output terminals of each input shuffler is connected to a respective input terminal of a different one of the N output shufflers (that is, each of the N output terminals of each input shuffler is connected to a respective input terminal of a different member of the set of N output shufflers). Each input and output shuffler is configured to output shuffled bits at its output terminals based on the input bits received at its input terminals, so as to balance (that is, equalize) the number of high-level logic bits outputted from each of the output terminals over time. In an embodiment, all of the shufflers operate in a substantially identical manner to each other.

Further embodiments of the present invention are described below.

BRIEF DESCRIPTION OF THE DRAWINGS/FIG.S

FIG. 5 is a list of assumptions used to perform a comparative simulation of the present invention.

Figure 2:
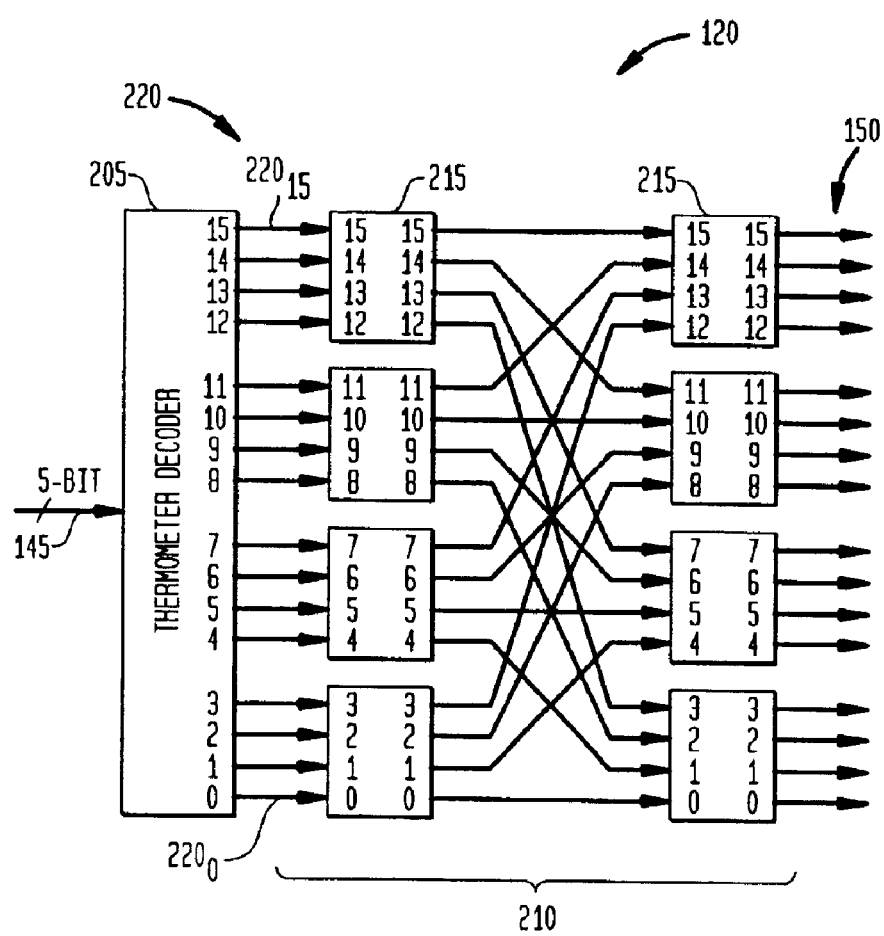
FIG. 2 is a schematic/block diagram of an example 16×16 data shuffler apparatus (where N=4), including a plurality of 4×4 data shufflers, used in a thermometer decoder/shuffler module of FIG. 1.
Figure 6:
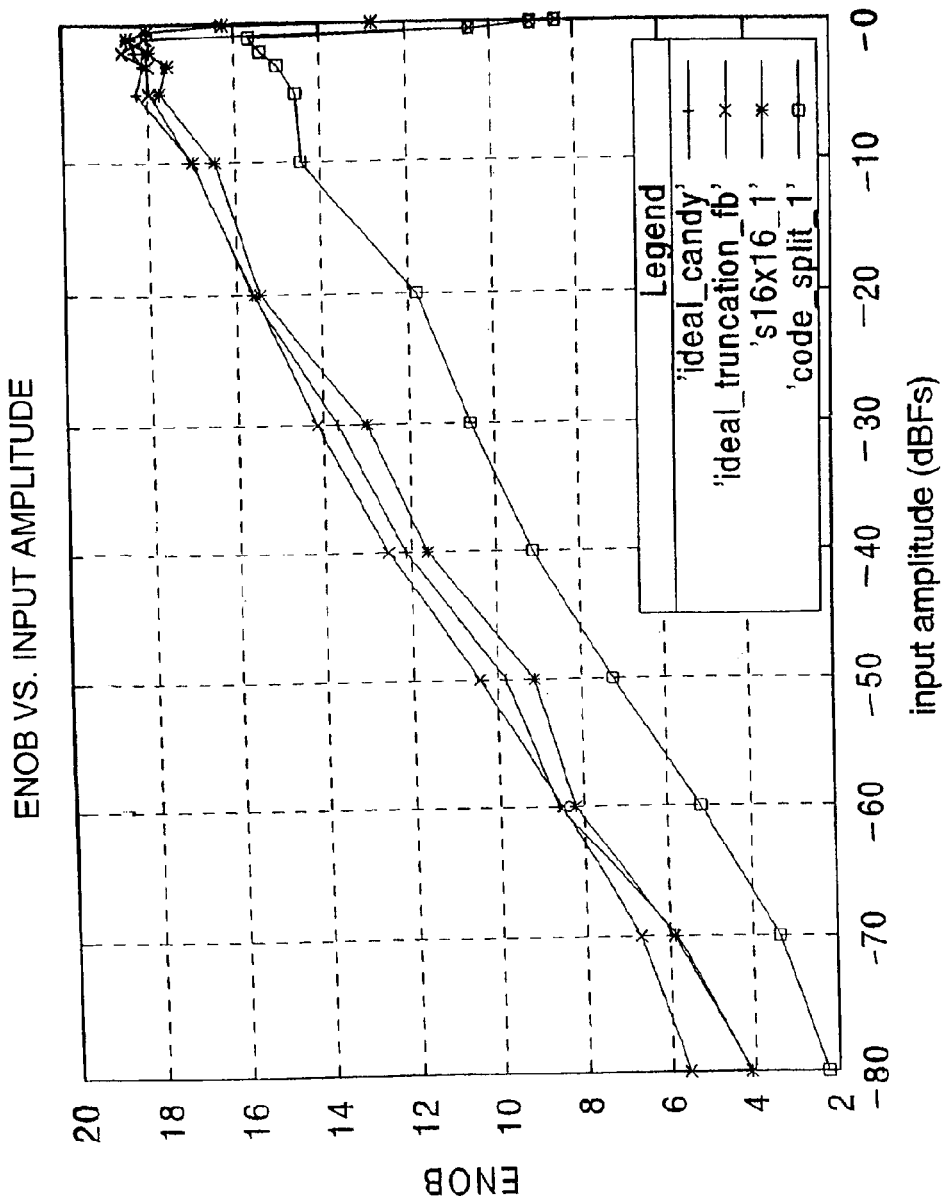

FIG. 6 is a comparative plot of input amplitude (in dB) vs. Effective Number of Bits (ENOB) for different DACs, including a DAC using the 16×16 data shuffler apparatus of FIG. 2. The comparative plot was generated from the comparative simulation of FIG. 5.

Figure 7:
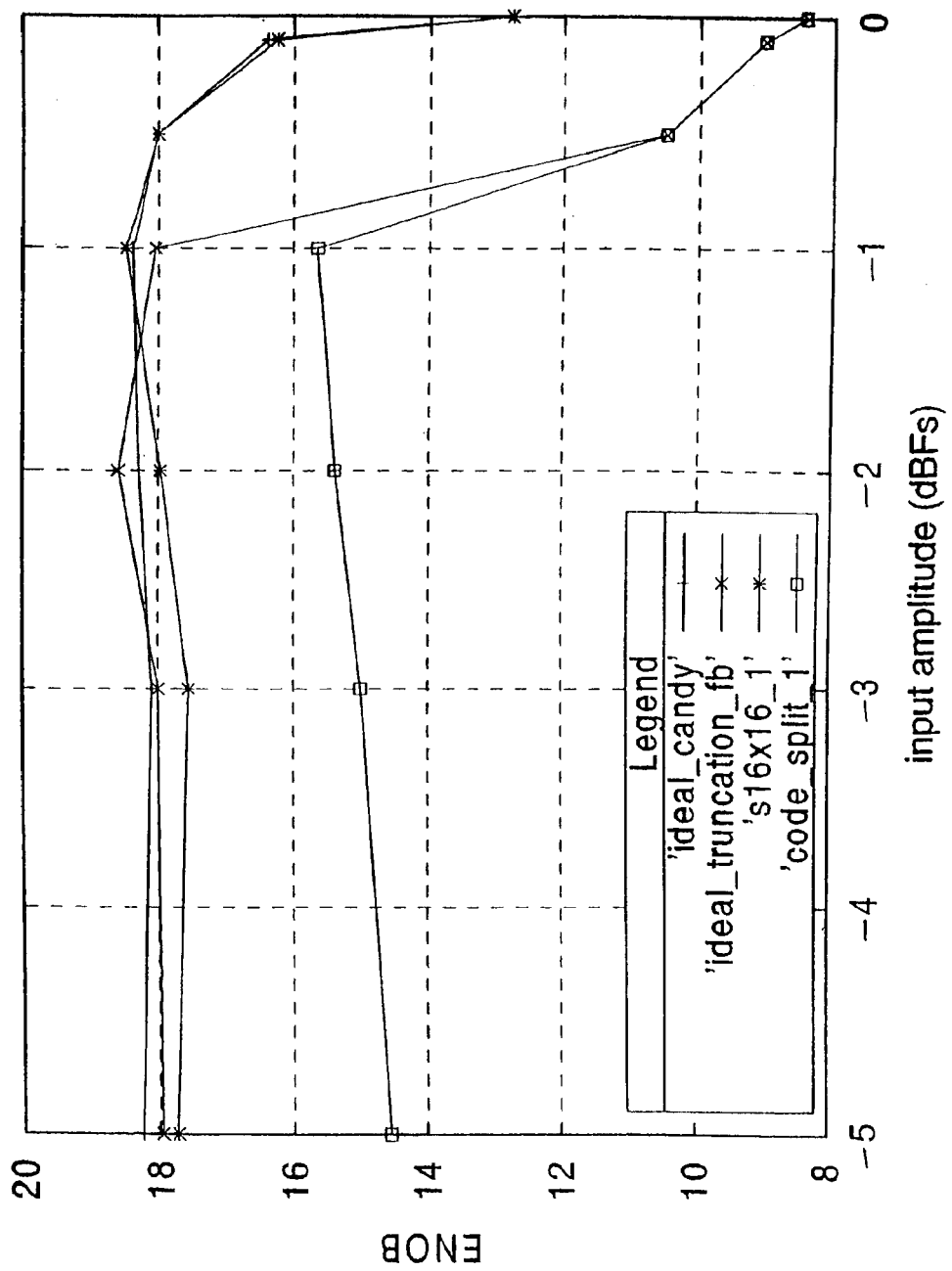

FIG. 7 is an illustration as in FIG. 6, but using an expanded scale for input amplitude.

DETAILED DESCRIPTION OF THE INVENTION

As used herein, the terms "logic bits," "logic signals," and "bits" are used interchangeably to refer to the same signals. Also, the terms "high-level bit," "logic '1'", and "logic-one," are interchangeable, as are the terms "low-level bit," logic '0'", and "logic-zero."

Figure 1:
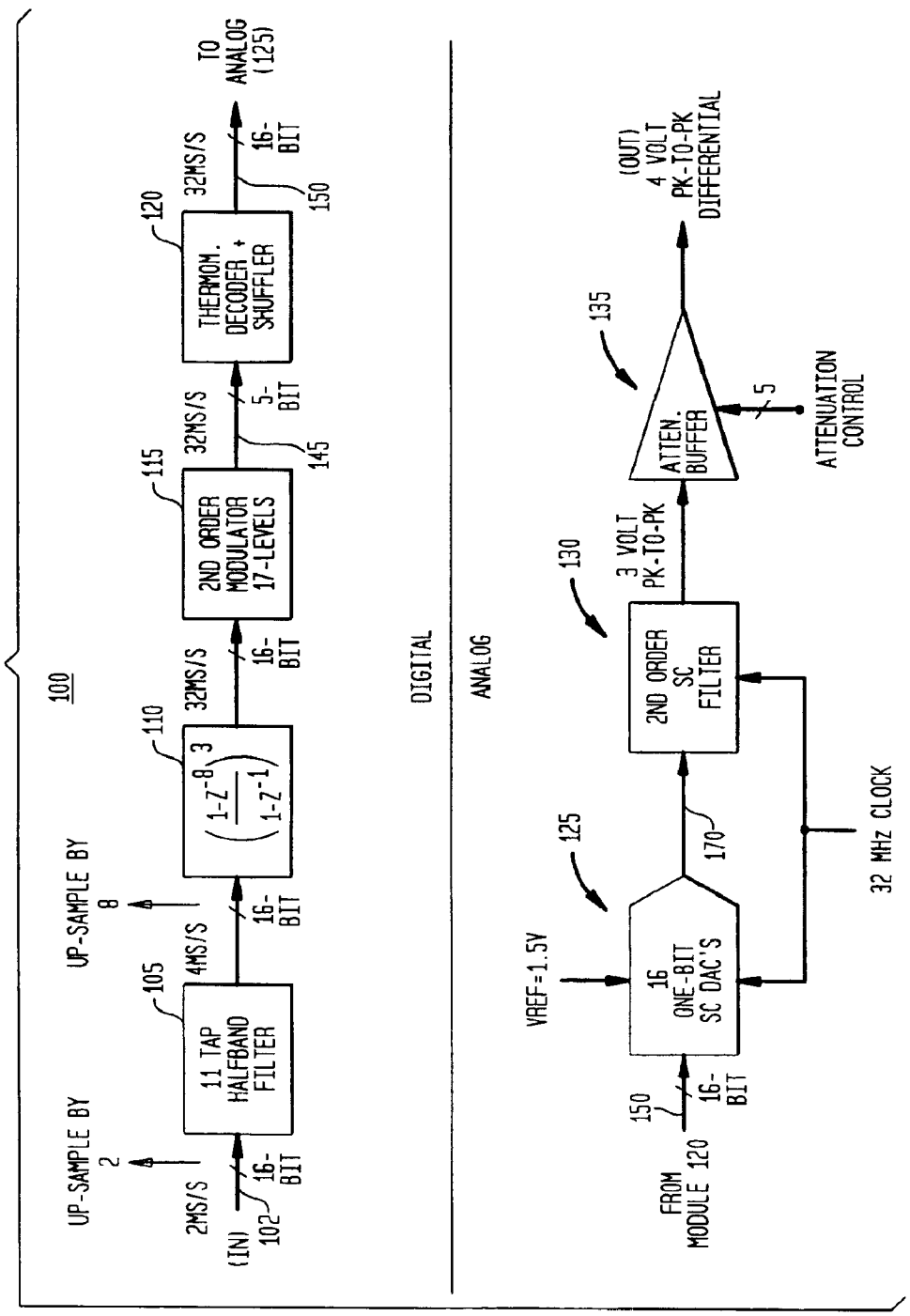
FIG. 1 is a block diagram of an example DAC apparatus in which the present invention can be used.

FIG. 1 is a block diagram of an example DAC apparatus 100 in which the present invention can be used. DAC apparatus processes an input signal 102 having an exemplary sample rate of 2 Mega-samples/second (Ms/s). DAC apparatus 100 includes, in series, a halfband filter 105, an interpolator 110, a modulator 115, a thermometer decoder and shuffler module 120, a multi-bit thermometer DAC 125 including multiple single-bit DACs, a switched-capacitor filter 130, and a buffer 135. Exemplary signal and device characteristics, such as filter characteristics, signal sample rates, signal bit-widths, and signal voltages, are indicated at different stages of signal processing in FIG. 1.

In DAC apparatus 100, modulator 115 generates a 5-bit modulated signal 145, and provides the modulated signal to thermometer decoder and shuffler 120 (also referred to as module 120). Module 120 performs thermometer decoding, and logic-bit shuffling in accordance with the present invention. Thus, module 120 generates, from 5-bit modulated signal 145, a 16-bit shuffled thermometer-decoded signal 150, and provides signal 150 to thermometer DAC 125. Module 120 shuffles logic bits, in a manner to be described below, to achieve dynamic element (that is, single-bit DAC) matching in the present invention.

Thermometer DAC 125 includes multiple (for example, sixteen) single-bit DACs. Each single-bit DAC receives a respective bit of shuffled thermometer-decoded signal 150, and converts that bit to a corresponding analog voltage. DAC 125 combines the resulting sixteen converted voltages into a single analog signal 170.

FIG. 2 is a block diagram of an example arrangement of thermometer decoder and shuffler module 120. Module 120 includes a binary-to-thermometer decoder 205, followed by an example data shuffler apparatus 210 configured and operated in accordance with the principles of the present invention. Data shuffler apparatus 210 includes a plurality of substantially identical data sub-shufflers 215 (which are also referred to as shufflers 215, for convenience). In the example depicted in FIG. 2, data shuffler apparatus 210 includes eight shufflers 215.

Thermometer decoder 205 generates a thermometer decoded signal 220 from modulated signal 145, in a manner that is well known in the art. Thermometer decoded signal 220 includes bits $220_0$–$220_{15}$ (arranged in a column in FIG. 2) representative of a 16-bit thermometer code. Thermometer decoder 205 provides decoded signal 220 to data shuffler apparatus 210. The plurality of shufflers 215, of data shuffler apparatus 210, are interconnected to each other and operate together in such a manner as to shuffle decoded bits 220 into shuffled, decoded bits 150.

Figure 2A:
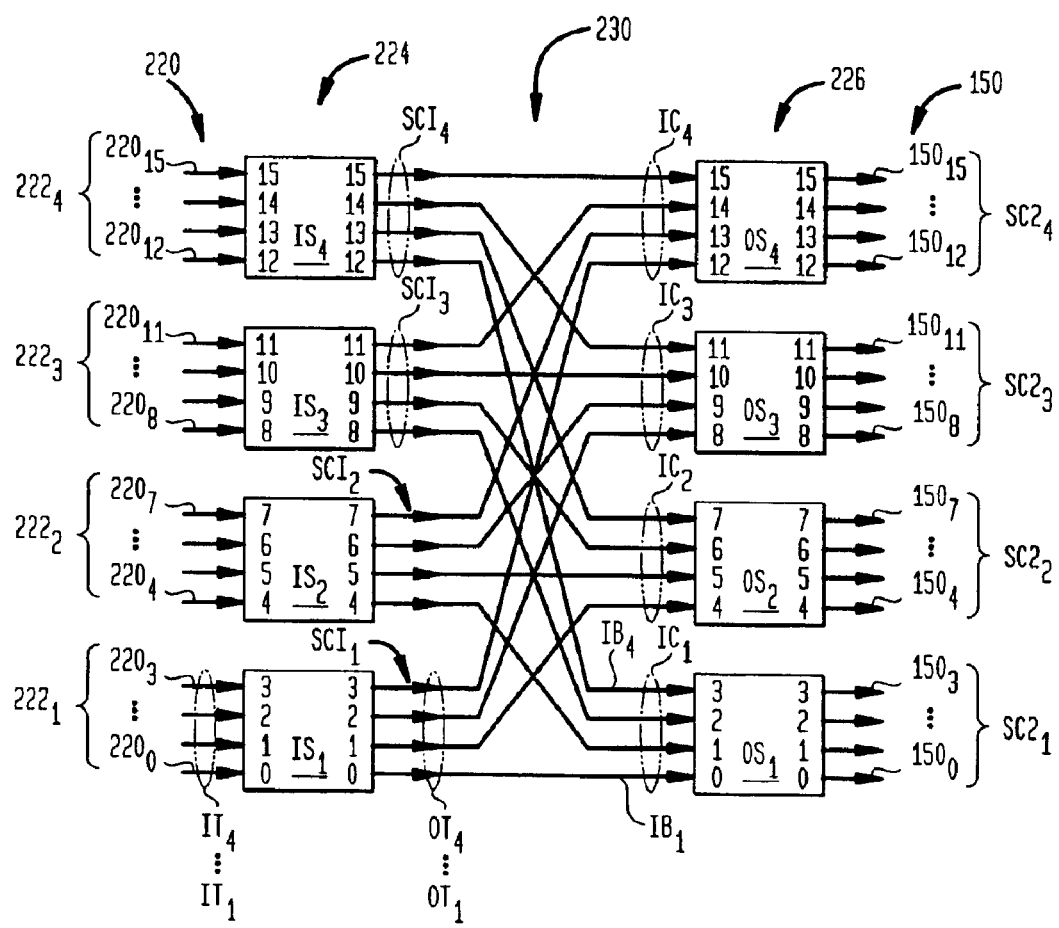
FIG. 2A is an expanded view of the data shuffler apparatus of FIG. 2.

FIG. 2A is an expanded view of data shuffler apparatus 210. Data shuffler apparatus 210 includes first stage or input shufflers $IS_1$–$IS_4$ (collectively, input shufflers 224), arranged in a first column of shufflers. Shuffler apparatus 210 also includes second stage or output shufflers $OS_1$–$OS_4$ (collectively, output shufflers 226), arranged in a second column of shufflers. An interconnection network 230 interconnects shufflers 224 and 226.

Each of shufflers $IS_1$–$IS_4$ and $OS_1$–$OS_4$ includes four input terminals $IT_1$–$IT_4$ and four output terminals $OT_1$–$OT_4$ (as indicated at input shuffler $IS_1$, for example). The input and output terminals are depicted as small square boxes coinciding with signal/connection lines in FIGS. 2 and 2A. As depicted in FIG. 2A, thermometer decoded bits 220 are divided into N (in this example, four) ordered sets of ordered bits $222_1$–$222_4$. Each input shuffler $IS_i$ receives at its input thermals $IT_1$–$IT_4$ respective decoded bits of the ordered set of bits $222_i$. For example, in the case where i=2, input shuffler $IS_2$ receives at its input terminals $IT_1$–$IT_4$ respective input bits $220_4$–$220_7$ of ordered bit set $222_2$.

Interconnection network 230 includes conductive traces/wires, or the like, that interconnect input shufflers $IS_1$–$IS_4$ with output shufflers $OS_1$–$OS_4$ according to the following generalized interconnection scheme or pattern:

output terminal $OT_j$ of input shuffler $IS_i$ is connected to input terminal $IT_i$ of output shuffler $OS_j$, for i=1 . . . 4 and j=1 . . . 4.

For example, in the case where i=2 and j=3, output terminal $OT_{j=3}$ of input shuffler $IS_{i=2}$ is connected to input terminal $IT_{i=2}$ of output shuffler $OS_{j=3}$.

Note that each input terminal $IT_i$ (for example, input terminals $IT_1$ . . . $IT_4$) corresponds to an input bit position i (for example, ordered input bit positions 1–4, respectively). Similarly, each output terminal $OT_i$ (for example, output terminals $OT_1$ . . . $OT_4$) corresponds to an output bit position i (for example, ordered output bit positions 1–4, respectively). Thus, input and output terminals can be thought of as being interchangeable with corresponding input and output bit positions in the present invention. The description herein uses subscripts to denote the different input and output terminals and corresponding bit positions.

In operation, each shuffler 215 shuffles the bits received at its input terminals, and outputs the shuffled received bits as output bits at its output terminals. For example, input shufflers $IS_1$–$IS_4$ separately shuffle respective input bit sets $222_1$–$222_4$, and output respective bit sets, referred to as shuffled codes $SC1_1$–$SC1_4$. Each shuffled code $SC1_i$ includes shuffled bits, designated $SB_1$–$SB_4$ (as indicated, for example, at input shuffler $IS_1$), having ordered bit positions within that shuffled code in accordance with their respective subscript designations (1–4, for example).

Interconnection network 230 directs the bits of shuffled codes $SC1_1$–$SC1_4$ into four different sets of bits, referred to as input codes $IC_1$–$IC_4$. In other words, interconnection network 230 forms input codes $IC_1$–$IC_4$ from shuffled codes $SC1_1$–$SC1_4$. Each input code $IC_i$ includes bits, designated $IB_1$–$IB_4$ (as indicated, for example, at output shuffler $OS_1$), having ordered bit positions within that input code in accordance with their respective subscript designations. Specifically, interconnection network 230 causes input codes $IC_1$–$IC_4$ to be formed from the shuffled codes $SC1_1$–$SC1_4$ in accordance with the following mapping pattern:

Bit $SB_j$ of shuffled code $SC1_i$ is the same as bit $IB_i$ of input code $IC1_j$, for i=1 . . . 4 and j=1 . . . 4.

For example, in the case where i=2 and j=3:

bit $SB_{j=3}$ of shuffled code $SC1_{i=2}$ is the same as bit $IB_{i=2}$ of input code $OS_{j=3}$.

Output shufflers $OS_1$–$OS_4$ separately shuffle respective input codes $IC_1$–$IC_4$, and output respective shuffled bit sets, referred to as shuffled codes $SC2_1$–$SC2_4$.

In the example arrangement of shuffler apparatus 210 depicted in FIGS. 2 and 2A, each shuffler 215 includes four input terminals and four output terminals. Thus, each shuffler 215 is referred to as a 4×4 data shuffler. Similarly, shuffler apparatus 210 includes sixteen input terminals (the collective input terminals of input shufflers $IS_1$–$IS_4$) and sixteen output terminals (the collective output terminals of output shufflers $OS_1$–$OS_4$). Thus, shuffler apparatus 210 is referred to as a 16×16 data shuffler.

More generally, according to the present invention, an $N^2 \times N^2$ shuffler apparatus includes 2N N×N shufflers, that is, N N×N input shufflers and N N×N output shufflers interconnected as described above, where N>1. For example, a 25×25 shuffler apparatus can be constructed using ten 5×5 shufflers. Such a shuffler includes five 5×5 input shufflers interconnected with five 5×5 output shufflers.

In the generalized shuffler apparatus arrangement having N input shufflers $IS_1$–$IS_N$ and N output shufflers $OS_1$–$OS_N$, where each shuffler has N input terminals and N output terminals, the connection pattern (and correspondingly, the mapping of coding bits) is generalized to: output terminal $OT_j$ (bit $SB_j$) of input shuffler $IS_i$ (code $SC1_i$) is connected to input terminal $IT_i$ (bit $IB_i$) of output shuffler $OS_j$ (code $IC_j$), for i=1 ... N and j=1 ... N.

Figure 3:
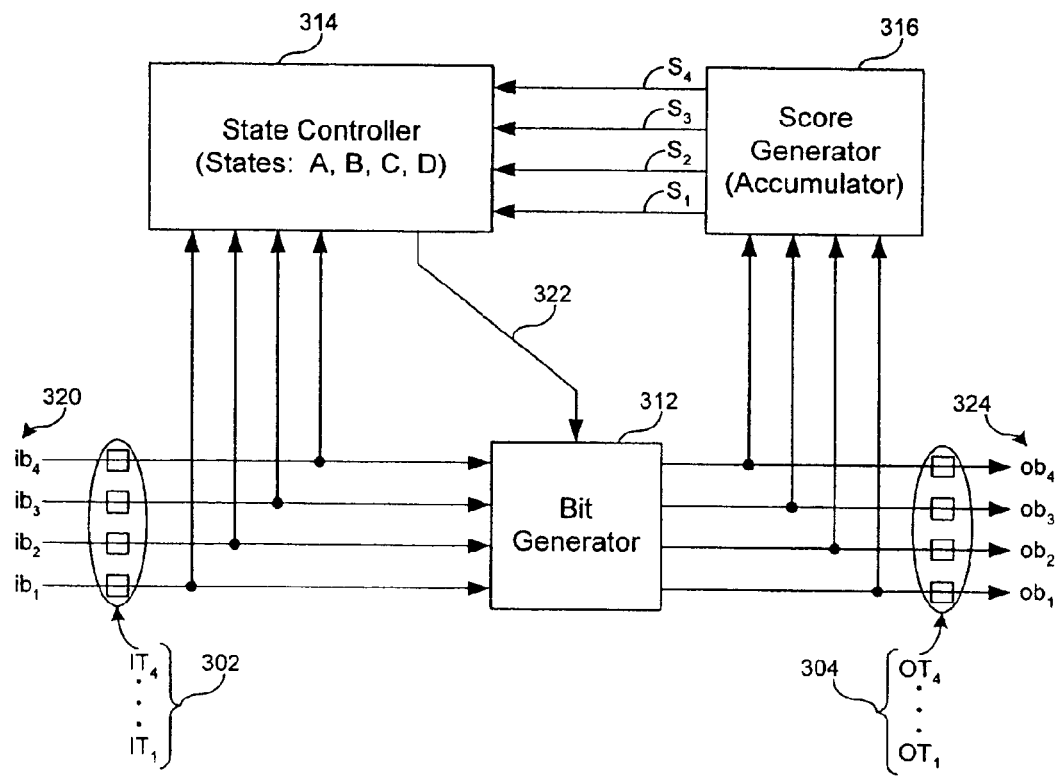
FIG. 3 is a block diagram of an example arrangement of a 4×4 data shuffler of FIG. 2.

FIG. 3 is a block diagram of an example arrangement of shuffler 215. Shuffler 215 includes input terminals $IT_1$–$IT_4$ (collectively, input terminals 302) and output terminals $OT_1$–$OT_4$ (collectively, output terminals 304). Shuffler 215 includes a bit generator 312 coupled between input and output terminals 302 and 304, a state controller 314 for controlling shuffler 215, and a score generator 316.

Shuffler 215 receives clock pulses, not shown, and operates on a cycle-by-cycle basis in response to the clock pulses. Over time, shuffler 215 receives successive sets of input bits at its input terminals 302, and generates a set of output bits at its output terminals 304 corresponding to each of the input bit sets. Shuffler 215 generates as set of output bits based on a corresponding set of input bits during a single cycle of the shuffler.

Over time, score generator 316 maintains a history of the number of high-level bits (that is, logic "1s") that have been outputted from each of output terminals 304. For example, score generator 316 generates scores $S_1$–$S_4$ representative of an accumulated number of high-level bits (logic "1s") that have been outputted from output terminals $OT_1$–$OT_4$, respectively. For example, score $S_1$ represents the number of "past" high-level bits that have been outputted from terminal $OT_1$, and so. Scores $S_1$–$S_4$ may be raw scores (that is, total accumulated high-level bits), or alternatively, relative scores, for example, scores that represent differences between the number of high-level bits that have been outputted from each of output terminals 304. Score generator 316 provides scores $S_1$–$S_4$ to state controller 314.

Input terminals $IT_1$–$IT_4$ receive respective input bits $ib_1$–$ib_4$ (collectively, input bits 320). hi response to input bits 320 and scores $S_1$–$S_4$, state controller 314 maintains and updates an operational state of shuffler 215, as is described below. Based on the state of shuffler 215, state controller 314 generates a set of control signals 322 for controlling bit generator 312, and provides control signals 322 to the bit generator. In response to control signals 322 and input bits $ib_1$–$ib_4$, bit generator 312 produces output bits $ob_1$–$ob_4$ (collectively, output bits 324), and outputs these bits from output terminals $OT_1$–$OT_4$, respectively. In an arrangement of shuffler 215, bit generator 312 may include multiplexer logic to direct various ones of input bits 320 received at input terminals 302 (such as high-level bits) to various ones of output terminals 304, responsive to control signals 322. Specifically, bit generator 312:

(i) outputs from output terminals 304, a same number of high-level bits as are received at input terminals 302;

(ii) outputs the high-level bits from output terminals associated with lowest scores among output terminals 304; and (iii) outputs the high-level bits from specific output terminals among output terminals 304 according to control signals 322, in a manner described below.

Further operational details of shuffler 215 are now described with reference to Tables 1 and 2, below. Table 1 includes a first (that is, left-most) column that lists all of the possible input bit combinations/sets for input bits 320. A second column lists the total number of high-level bits included in each bit combination in the first column.

TABLE 1

| Input Bits: designations/positions | | | | |
|---|---|---|---|---|
| $ib_1$ 1 | $ib_2$ 2 | $ib_3$ 3 | $ib_4$/ 4 | Total No. of logic "1s" |
| 0 | 0 | 0 | 0 | 0 |
| 0 | 0 | 0 | 1 | 1 |
| 0 | 0 | 1 | 0 | 1 |
| 0 | 0 | 1 | 1 | 2 |
| 0 | 1 | 0 | 0 | 1 |
| 0 | 1 | 0 | 1 | 2 |
| 0 | 1 | 1 | 0 | 2 |
| 0 | 1 | 1 | 1 | 3 |
| 1 | 0 | 0 | 0 | 1 |
| 1 | 0 | 0 | 1 | 2 |
| 1 | 0 | 1 | 0 | 2 |
| 1 | 0 | 1 | 1 | 3 |
| 1 | 1 | 0 | 0 | 2 |
| 1 | 1 | 0 | 1 | 3 |
| 1 | 1 | 1 | 0 | 3 |
| 1 | 1 | 1 | 1 | 4 |

Table 2 below is an example state transition table corresponding to shuffler 215, that is, the shuffler operates in accordance with the state transition table. Table 2, Column 1 (the left-most column) lists the possible total numbers of high-level bits that may be present at input terminals 320 at any given time. These totals are take from Column 2 of Table 1, above.

TABLE 2

| Input Bits: Total No. of logic "1s" (i.e., high-level bits) | Current State (CS) | Next State (NS) | Output Bits: designations/positions | | | |
|---|---|---|---|---|---|---|
| | | | $ob_1$ 1 | $ob_2$ 2 | $ob_3$ 3 | $ob_4$/ 4 |
| 0 | D | D | 0 | 0 | 0 | 0 |
| | A | A | 0 | 0 | 0 | 0 |
| | B | B | 0 | 0 | 0 | 0 |
| | C | C | 0 | 0 | 0 | 0 |
| 1 | D | A | 1 | 0 | 0 | 0 |
| | A | B | 0 | 1 | 0 | 0 |
| | B | C | 0 | 0 | 1 | 0 |
| | C | D | 0 | 0 | 0 | 1 |
| 2 | D | B | 1 | 1 | 0 | 0 |
| | A | C | 0 | 1 | 1 | 0 |
| | B | D | 0 | 0 | 1 | 1 |
| | C | A | 1 | 0 | 0 | 1 |

TABLE 2-continued

| Input Bits: Total No. of logic "1s" (i.e., high-level bits) | Current State (CS) | Next State (NS) | Output Bits: designations/positions | | | |
|---|---|---|---|---|---|---|
| | | | $ob_1$ 1 | $ob_2$ 2 | $ob_3$ 3 | $ob_4$/ 4 |
| 3 | D | C | 1 | 1 | 1 | 0 |
| | A | D | 0 | 1 | 1 | 1 |
| | B | A | 1 | 0 | 1 | 1 |
| | C | B | 1 | 1 | 0 | 1 |
| 4 | D | D | 1 | 1 | 1 | 1 |
| | A | A | 1 | 1 | 1 | 1 |
| | B | B | 1 | 1 | 1 | 1 |
| | C | C | 1 | 1 | 1 | 1 |

At any given time, shuffler 215 can be in any one of the following four possible operational states: state A, B, C or D. These states depend on the scores $S_1$–$S_4$ for the output terminals $OT_1$–$OT_4$ (that is, the scores for respective bit positions 1–4). The states are defined below:

State D: all of the scores $S_1$–$S_4$ are even. That is, the score for each output terminal (bit position) is equal to the score for each other output terminal (bit position);

State A: score $S_1$ for output terminal $OT_1$ (bit position 1) is ahead of the scores for all the other output terminals (bit positions) by a count of 1;

State B: scores $S_1$, $S_2$ for output terminals $OT_1$, $OT_2$ (bit positions 1, 2), are ahead of the other scores by a count of 1; and State C: scores $S_1$, $S_2$, $S_3$ for output terminals $OT_1$, $OT_2$, $OT_3$ (bit positions 1, 2, 3) are ahead by 1.

Table 2, Column 2 lists, for each of the possible total number of high-level input bits listed in Column 1, the corresponding possible current states (CSs) that shuffler 215 may be in at any given time.

Table 2, Column 4 lists the output bit combinations (for example, combinations "0000," "0101," and so on) that shuffler 215 outputs from output terminals 304 in response to a given total of number of high-level input bits received by shuffler 215 (listed in Column 1) and a corresponding given current state of the shuffler (listed in Column 2).

Table 2, Column 3 lists the next state (NS) of shuffler 215 corresponding the current state and the total number of high-level input bits. In operation, for example, if the total number of high-level input bits applied to shuffler 215 is two (2), and the shuffler is in current state A (that is, score $S_1$ is ahead by one), then shuffler 215 outputs bit pattern "0110," and transitions to next state C (that is, scores $S_1$, $S_2$, $S_3$ are ahead by one). If the total number of high-level input bits is two, and shuffler 215 is in current state C, then shuffler 215 outputs bit pattern "1001," and transitions to next state A, and so on.

According to Table 2, shuffler 215 outputs high-level logic bits, if any, from output terminals/bit positions having successively numbered bit designations (for example, bit designations having increasing numbers), beginning with the output terminal/bit position having a lowest numbered bit designation among the output terminals/bit positions corresponding to the lowest scores. In cases where there are a sufficient number of high-level input bits, the high-level output bits roll-over from the highest or most significant bit position "4" to the lowest or least significant bit position "0" In other words, the output bit positions produce high-level bits in a modulo-4 manner.

As mentioned above, over time, shuffler 215 equalizes the number of high-level bits output from (that is, produced at) output terminals $OT_1$–$OT_4$, and thus from bit positions 1–4. In one arrangement, shuffler 215 keeps score of the accumulated logic "1s" at each output terminal/bit position and directs logic "1s" received at the input terminals to the output terminals/bit position(s) having the lowest score(s). From the state transition table, it can be seen that the error in accumulated "1s" between any of the output terminals/bit positions corresponds to a difference of one, at most.

From the above, it is seen that each shuffler 215 in shuffler apparatus 210 is configured to:

(i) at any given time, generate the same number of logic-ones at its outputs as are present at its inputs; and (ii) equalize over time the number of logic-ones generated at its respective outputs.

Thus, as a result of the operation of each of the shufflers 215 and the interconnections 230 between the shufflers 215 (that is between input and output shufflers 224 and 226), shuffler apparatus 210 is similarly configured to:

(i) at any given time, generate the same number of logic-ones at its outputs (that is, at the outputs corresponding to thermometer-decoded, shuffled signals $150_0$–$150_{15}$) as are present at its inputs (that is, that are included in signals $220_0$–$220_{15}$); and (ii) equalize over time the number of logic-ones carried by each of the signals $150_0$–$150_{15}$ (that is, at each of the bit positions corresponding to each of these logic signals).

Because each of the logic signals $150_0$–$150_{15}$ (carrying equalized logic-ones) drives a respective one of the sixteen single-bit DACs in thermometer DAC 125, each of the single-bit DACs performs equal work over time. This results in dynamic element matching between the single-bit DACs because, over time, each of the single-bit DACs contributes essentially the same amount to summed output signal 170, and differences between single-bit DACs are averaged-out over time. For example, no one single-bit DAC dominates over time. Mathematically, over time, the number of accumulated "1s" for each output terminal/bit position is represented by the following expression(s):

$$N_{1o}=(N_{1i}+N_{2i}+N_{3i}+N_{4i})/4,$$

$$N_{2o}=(N_{1i}+N_{2i}+N_{3i}+N_{4i})/4,$$

$$N_{3o}=(N_{1i}+N_{2i}+N_{3i}+N_{4i})/4,$$

$$N_{4o}=(N_{1i}+N_{2i}+N_{3i}+N_{4i})/4, \text{ and}$$

where each $N_{io}$ (on the left-hand side of the equation) represents the number of accumulated "1s" for output terminal/bit position i, for i=1 . . . 4 (where each $N_{io}$ corresponds to score $S_i$), and each $N_{ji}$ (on the right-side of the equation) represents the number of accumulated "1s" for input terminal/bit position j, for j=1 . . . 4 (on the right-side of the equation, "i" means "input").

This implies the matching between the output bit positions is perfect for DC signals. For signals away from DC, the errors will be proportional to the highpass transfer function mentioned above.

In data shuffler apparatus 210, the following similar input/output relationship between accumulated "1s" follows from the signal flow caused by connection pattern 230:

$$Ot1 = (In1 + In2 + \ldots + In16)/16$$

$$Out2 = (In1 + In2 + \ldots + In16)/16$$

.
.
.

$$Out16 = (In1 + In2 + In16)/16$$

where: In1, In2, ..., In16 represent the number of "1s" received at the respective inputs terminals of data shuffler apparatus 210 over time (for example, in respective signals $120_0$, $120_1$, ... $120_{15}$,), and Out1, Out2, ... Out16 represent the number of "1s" output from the output terminals of data shuffler apparatus 210 over time (for example, in respective signals $150_0$, $150_1$, ... $150_{15}$,).

In data shuffler apparatus 210, like shufflers 215, for DC signals, the outputs match perfectly or nearly perfectly. The use of shufflers 215 reduces the hardware complexity of 16×16 shuffler apparatus 210. Shuffler apparatus 210 of the present invention realizes dynamic element matching for 16 inputs to 16-outputs with substantially reduced hardware complexity compared to conventional dynamic element matching systems. For example, the entire state for a 16×16 shuffler can be implemented using only 16 flip-flops instead of 32 flip-flops in conventional systems, for example.

Figure 4:
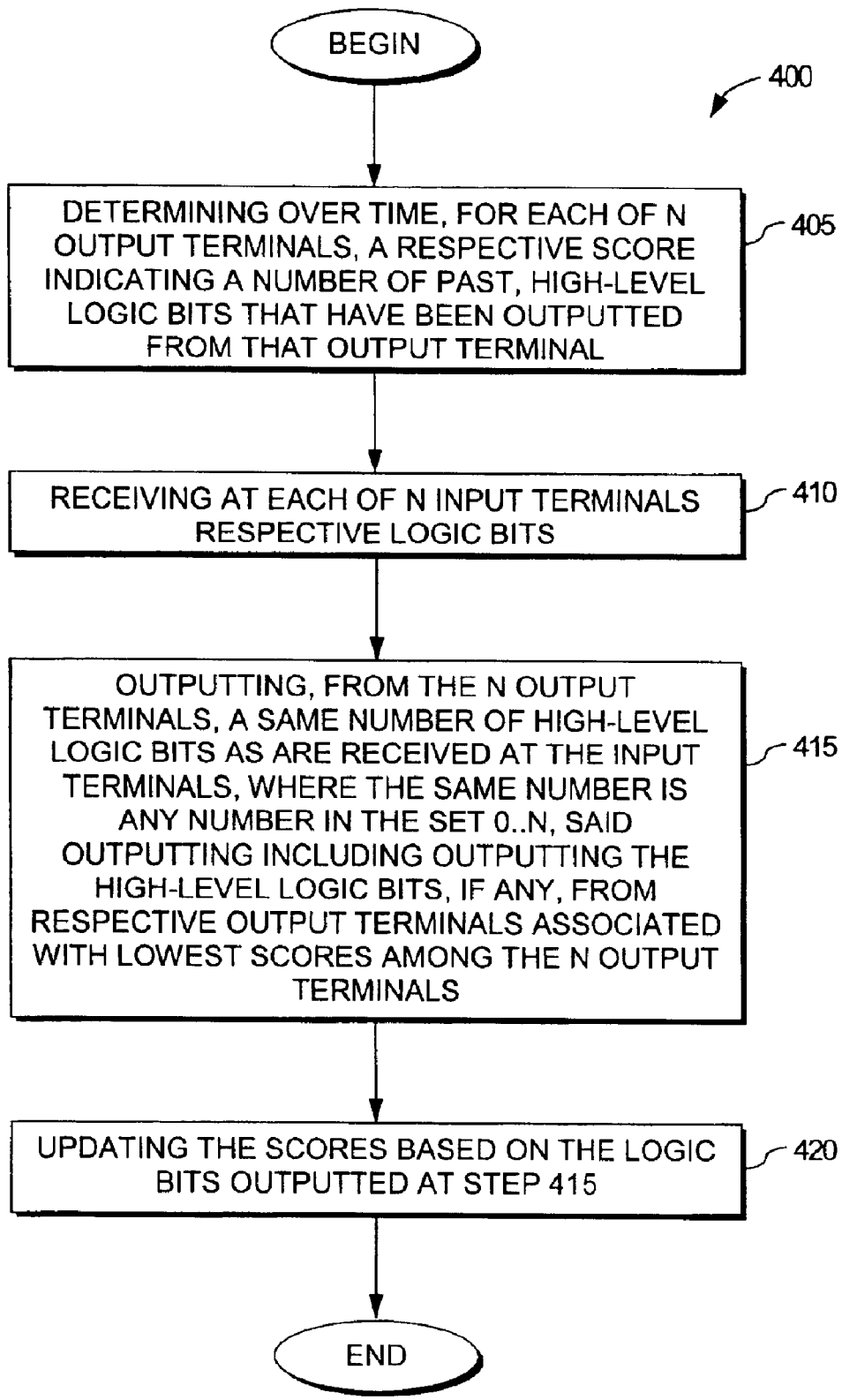
FIG. 4 is a flow chart of an example method of shuffling data/logic bits using an N×N data shuffler, such as the data shuffler of FIG. 3.

FIG. 4 is a flowchart of an example method 400 of shuffling input bits, that may be implemented in a shuffler, such as shuffler 215. The shuffler includes N input terminals and N output terminals, where N=4 for shuffler 215, for example.

A first step 405 includes determining over time for each output terminal (for example, output terminal $OT_i$) a respective score (for example, $S_i$) indicating an accumulated number of past, high-level logic bits that have been outputted from that output terminal.

A next step 410 includes receiving at the N input terminals respective logic bits. For example, in shuffler 215, this step includes receiving input bits $ib_1$–$ib_4$ at respective input terminals $IT_1$–$IT_4$.

A next step 415 includes outputting, from the N output terminals, a same number of high-level logic bits as are received at the N input terminals, where the same number is any number in the set 0 ... N. This outputting step includes outputting the high-level logic bits, if any, from respective output terminals associated with lowest scores among the N output terminals. For example, in shuffler 215, bit generator 312 outputs, from output terminals 304, a same number of high-level logic bits as are received at input terminals 302. Bit generator 312 outputs the high-level logic bits, if any, from respective output terminals associated with lowest scores ($S_1$–$S_4$) among the output terminals.

Step 415 also includes outputting the high-level logic bits, if any, from output terminals having successively numbered bit designations, beginning with the output terminal having a lowest numbered bit designation among the output terminals having the lowest scores. This outputting arrangement can be seen in the state transition table (Table 2) described above.

A next step 420 includes updating the scores (for example, scores $S_1$–$S_4$) based on the logic bits outputted at step 415.

Steps 405–420 are repeated so as to equalize the accumulated scores (for example, scores $S_1$–$S_4$) over time.

Figure 4A:
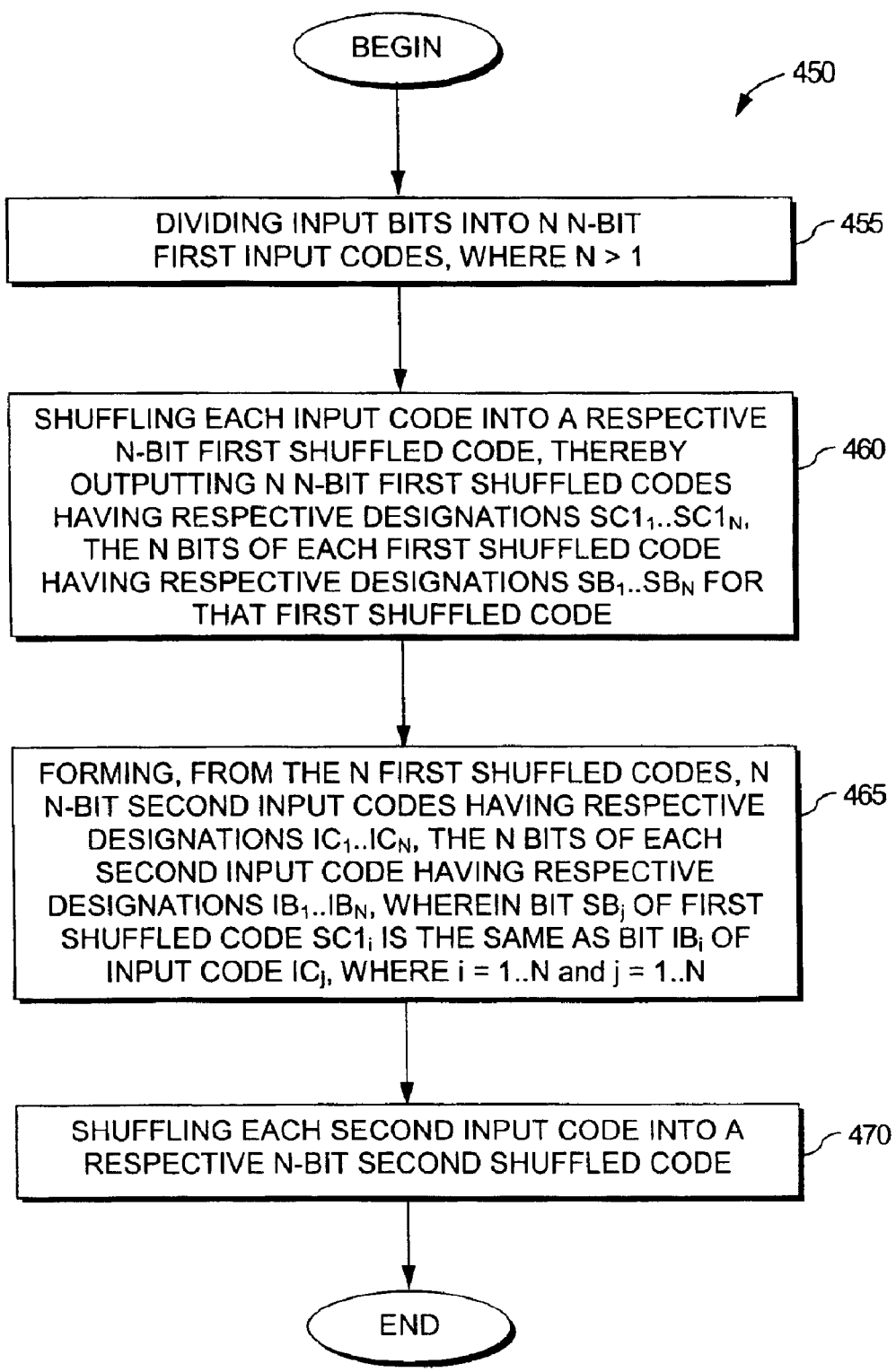
FIG. 4A is a flow chart of an example method of shuffling data/logic bits using a data shuffler apparatus, such as the data shuffler apparatus of FIG. 2A.

FIG. 4A is a flowchart of an example method 450 of shuffling a plurality of input bits using a data shuffler apparatus, such as data shuffler apparatus 210. Method 450 achieves dynamic element matching of multiple DAC elements, such as the single-element DAC elements used in multi-element DAC 125.

A first step 455 includes dividing the plurality of input bits into N N-bit first input codes, where N>1. For example, this step includes forming input bit sets $222_1$–$222_4$.

A next step 460 includes shuffling each input code (for example, codes $222_1$–$222_4$) into a respective N-bit first shuffled code, thereby outputting N N-bit first shuffled codes having respective designations $SC1_1$ ... $SC1_N$, the N bits of each first shuffled code having respective designations $SB_1$ ... $SB_N$ for that first shuffled code. The shuffling in this step may include the steps of method 400, for example. However, other data shuffling methods may be used.

A next step 465 includes forming, from the N first shuffled codes, N N-bit second input codes having respective designations $IC_1$ ... $IC_N$, the N bits of each second input code having respective designations $IB_1$ ... $IB_N$, wherein bit $SB_j$ of first shuffled code $SC1_i$ is the same as bit $IB_i$ of input code $IC_j$, where i=1 ... N and j=1 ... N.

A next step 470 includes shuffling each second input code into a respective N-bit second shuffled code. The data shuffling in this step may include the steps of method 400, for example. However, other data shuffling methods may be used.

FIG. 5 is a list of assumptions used to perform a comparative simulation of different DACs, including the DAC of the present invention using modulator 115 and shuffler apparatus 210.

FIG. 6 is a comparative plot of input amplitude (in dB) vs. Effective Number of Bits (ENOB) for different DACs, including the DAC of the present invention using modulator 115 and shuffler apparatus 210. The comparative plot was generated from the comparative simulation mentioned in connection with FIG. 5. The ENOB is a performance metric for the various DACs compared in the plots. The plot labeled "s16×16__1" represents the performance of the DAC of the present invention. The plot labeled "ideal__candy" represents the performance of an ideal DAC having perfectly matched DAC elements (that is, a DAC having no mismatches).

FIG. 7 is an illustration as in FIG. 6, but using an expanded scale for input amplitude.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A data shuffler comprising:
   (a) a plurality of input terminals configured to receive input bits;
   (b) a bit generator;
   (c) a state controller configured to control the bit generator;
   (d) a plurality of output terminals configured to output bits produced by the bit generator; and
   (e) a score generator for maintaining the number of high-level bits that have been outputted from each of the plurality of output terminals,
   wherein the plurality of output terminals are configured to output high-level bits in order of output terminals having the lowest scores produced by the score generator.

2. The data shuffler of claim 1, wherein the bit generator is configured so as to:
   (i) output, through the output terminals, a same number of high-level bits as are received by the input terminals; and
   (ii) equalize over time the number of high-level bits outputted from each output terminal in the plurality of output terminals.

3. The data shuffler of claim 1, wherein:
   the output terminals have respective successively numbered bit designations, and
   the output terminals are configured to output high-level bits in order beginning with the output terminal having a lowest numbered bit designation among the output terminals having the lowest scores.

4. The data shuffler of claim 1, wherein the bit generator comprises multiplexer logic to direct various ones of the input bits received at the input terminals to various ones of the output terminals.

5. The data shuffler of claim 1, wherein the state controller is further configured to maintain a current operational state based on score combinations for the plurality of output terminals.

6. A signal processing system comprising a plurality of data shufflers according to claim 1, wherein said plurality of data shufflers are separated into a set of input data shufflers and output data shufflers.

7. The signal processing system of claim 6, further comprising:
   an interconnection system connecting the input data shufflers to the output data shufflers.

8. A method of signal modulation, comprising:
   (a) receiving a set of input bits that include high-level bits, low-level bits, or a combination of high- and low-level bits;
   (b) outputting, through a set of output terminals, a same number of high-level bits as are received in said step (a);
   (c) determining over time a respective score indicating the number of past, high-level bits outputted by each output terminal.

9. The method of claim 8, wherein said step (b) includes outputting one or more high-level bits from one or more respective output terminals having the lowest scores.

10. The method of claim 8, further comprising:
    (d) updating the scores based on the bits outputted at step (b); and
    (e) repeating steps (a) through (d) so as to equalize the scores over time.

11. The method of claim 8, wherein the output terminals have respective numbered bit designations, and
    step (b) comprises outputting any high-level bits from output terminals having successively numbered bit designations, in order beginning with the output terminal having a lowest numbered bit designation among the output terminals having the lowest scores.

* * * * *